United States Patent [19]
Nath et al.

[11] Patent Number: 5,181,968
[45] Date of Patent: Jan. 26, 1993

[54] PHOTOVOLTAIC DEVICE HAVING AN IMPROVED COLLECTOR GRID

[75] Inventors: Prem Nath, Rochester Hills; Craig Vogeli, New Baltimore, both of Mich.

[73] Assignee: United Solar Systems Corporation, Troy, Mich.

[21] Appl. No.: 719,917

[22] Filed: Jun. 24, 1991

[51] Int. Cl.[5] ................ H01L 31/04; H01L 31/18
[52] U.S. Cl. ............................. 136/256; 136/258; 437/2; 437/4; 437/180; 437/181
[58] Field of Search ........... 136/256, 258 AM; 437/2, 437/4–5, 180–181

[56] References Cited

U.S. PATENT DOCUMENTS

| | | | |
|---|---|---|---|
| 4,532,372 | 7/1985 | Nath et al. | 136/256 |
| 4,590,327 | 5/1986 | Nath et al. | 136/256 |
| 4,598,306 | 7/1986 | Nath et al. | 357/30 |
| 4,612,410 | 9/1986 | Hewig et al. | 136/256 |
| 4,633,034 | 12/1986 | Nath et al. | 136/256 |
| 4,666,033 | 12/1986 | Nath et al. | 136/256 |
| 4,695,674 | 9/1987 | Bar-on | 136/256 |
| 5,084,107 | 1/1992 | Deguchi et al. | 136/256 |

*Primary Examiner*—Aaron Weisstuch
*Attorney, Agent, or Firm*—Krass & Young

[57] ABSTRACT

An improved photovoltaic device in which an electrically conductive adhesive is employed to affix the grid structure to the upper electrode thereof. By appropriately selecting the resistivity of the conductive adhesive, normal photogenerated current flow is readily accommodated, while shunted current flow, through patent or latent defects is substantially eliminated.

23 Claims, 1 Drawing Sheet

PHOTOVOLTAIC DEVICE HAVING AN IMPROVED COLLECTOR GRID

FIELD OF THE INVENTION

This invention relates generally to semiconductor devices, and more particularly, to (1) thin film photovoltaic devices incorporating an improved charge carrier collecting assembly adapted to minimize the effects of short circuit defects located within the photovoltaic device; and (2) methods of fabricating photovoltaic devices which incorporate such an improved charge carrier collecting assembly.

BACKGROUND OF THE INVENTION

Single crystal photovoltaic devices have been utilized for some time as sources of electrical power because they are inherently non-polluting, silent, and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their amorphous counterparts, and (3) are expensive and time consuming to fabricate.

Recently, considerable efforts have been made to develop systems for depositing amorphous semiconductor materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous," as used herein, includes all materials or alloys which have long range disorder, although they may have short or intermediate range order or even contain, at times, crystalline inclusions.

It is now possible to prepare amorphous silicon alloy material by glow discharge chemical vapor deposition. The silicon alloy material possesses (1) acceptably reduced concentrations of localized states in the energy gaps thereof, and (2) high quality electronic properties. Such techniques have been fully described in U.S. Pat. No. 4,226,898, entitled Amorphous Semiconductors Equivalent To Crystalline Semiconductors, issued to Stanford R. Ovshinsky and Arun Madan on Oct. 7, 1980, the disclosure of which is incorporated herein by reference. As disclosed in this patent, fluorine introduced into the discrete layers of amorphous silicon alloy material operates to substantially reduce the density of the localized states therein and facilitates the addition of other alloying materials, such as germanium.

Unlike crystallize silicon which is limited to batch processing for the manufacture of solar cells, amorphous silicon alloys can be deposited in multiple layers over large area substrates to form solar cells in a high volume, continuous processing system. Such continuous processing systems are disclosed in U.S. Pat. No. 4,400,409 entitled "A Method Of Making P-Doped Silicon Films And Devices Made Therefrom"; U.S. Pat. No. 4,410,558 entitled "Continuous Amorphous Solar Cell Production System"; U.S. Pat. No. 4,438,723, entitled "Multiple Chamber Deposition And Isolation System And Method"; U.S. Pat. No. 4,492,181 entitled "Method and Apparatus For Continuously Producing Tandem Amorphous Photovoltaic Cells"; and U.S. Pat. No. 4,485,125 entitled "Method and Apparatus For Continuously Producing Tandem Amorphous Photovoltaic Cells", the disclosures of which are incorporated herein by reference. As disclosed in these patents, a substrate may be continuously advanced through a succession of interconnected deposition chambers, wherein each chamber is dedicated to the deposition of a specific semiconductor material. In making a photovoltaic device of p-i-n type configuration, the first chamber is dedicated for depositing a p-type layer of silicon alloy material, the second chamber is dedicated for depositing an intrinsic layer of amorphous silicon alloy material, and the third chamber is dedicated for depositing a layer of n-type silicon alloy material.

Since each deposited layer of silicon alloy material, and especially the intrinsic layer, must be of high purity, (1) the deposition environment in the intrinsic deposition chamber is isolated, by specially designed gas gates, from the doping constituents introduced into the constituents into the intrinsic chamber, (2) the substrate is carefully cleansed prior to initiation of the deposition process to remove contaminants from the surface thereof, (3) all of the chambers which combine to form the deposition apparatus are sealed and leak checked to prevent the influx of environmental contaminants, (4) the deposition apparatus is evacuated and flushed with a sweep gas to remove contaminants from the interior walls thereof, and (5) only the purest reaction gases are employed from which to form the layers of silicon alloy material. In other words, every possible precaution is taken to insure that the sanctity of the vacuum envelope formed by the plurality of interconnected chambers of the deposition apparatus remains uncontaminated by impurities, regardless of origin.

The layers of silicon alloy thus deposited in the vacuum envelope of the deposition apparatus may be utilized to form a photovoltaic device including one or more p-i-n cells, one or more n-i-p cells, Schottky barrier devices, photodiodes, phototransistors, or the like. Additionally, by making multiple passes through the succession of deposition chambers, or by providing an additional array of deposition chambers, multiple stacked cells of various configurations may be obtained.

Most photovoltaic devices, having either single cell or multiple cell structures, preferably include a light reflecting back reflector for increasing the percentage of incident light reflected from the substrate back through the active layer of silicon alloy material of the cells. It should be obvious that the use of a back reflector increases the amount of light which passes through the active layer of silicon alloy material, thus increasing the amount of incident light which is converted to electricity, and increasing the operational efficiency of the photovoltaic device. However, all layers, other than the photoactive layers of silicon alloy material, deposited atop the light incident surface of the substrate must be substantially transparent (to 35 nanometers to one micron wavelength light) so as to pass a high percentage of incident light from the anti-reflective coating atop the photovoltaic cell to the highly reflective surface of the back reflector from which it is redirected through and absorbed by the photoactive layer of silicon alloy material.

The back reflector may be formed atop the deposition surface of the substrate if an opaque substrate is employed. The back reflector may be either specular or diffuse. With either type of back reflector, light which has initially passed through the layers of silicon alloy material from which the photovoltaic device is fabricated without being absorbed, is redirected by the highly reflective material of the back reflector to pass, once again, through the photoactive layers. The additional pass results in increased photon absorption and charge carrier generation, thereby providing increased short circuit current.

The aforedescribed thin film amorphous silicon alloy materials offer several distinct advantages over crystalline materials, insofar as they can be easily and economically fabricated to cover large areas by the newly developed mass production processes. However, in the fabrication of said silicon alloy materials by the aforementioned processes, the presence of current-shunting defects has been noted. These defects have (1) seriously impaired the performance of the photovoltaic devices fabricated therefrom and (2) detrimentally affected production yield. These process-related defects are thought to either (1) be present in the morphology of the substrate electrode, or (2) develop during the deposition of the multiple layers of silicon alloy material. The instant invention is directed toward eliminating, or at least substantially reducing, the effects of these current-shunting defects.

The most important of these defects may be characterized as "shunts," "short-circuits," defect regions, or low resistance current paths. Before the suspected causes of these defects are explained, it is helpful to note the thicknesses of the deposited of silicon alloy material layers. In a typical p-i-n type photovoltaic device, the "p" layer is on the order of 75-200 Angstroms thick, the intrinsic layer is on the order of 3,500 Angstroms thick, and the "n" layer is on the order of 75-200 Angstroms thick, thereby providing a total semiconductor body thickness of only about 4,000 Angstroms. It should therefore be appreciated that irregularities disposed on the deposition surface, however small, may not be fully covered by the conformally deposited layers of silicon alloy material.

Shunt defects are present when one or more low resistance current paths develop between the upper and lower electrodes of the photovoltaic device. Under operating conditions, a photovoltaic device in which a shunt defect has developed, exhibits either (1) low power output, since electrical current collected at the electrodes flows through the defect region (the path of least resistance) in preference to an external load, or (2) complete failure where sufficient current is shunted through the defect region to "burn out" the device.

While shunt-type defects always deleteriously affect the performance of photovoltaic devices, their effect is greatest when the devices in which they are incorporated are operated under relatively low illumination such as room light, vis-a-vis, high intensity illumination such as AM-1. Under room light illumination, the load resistance of the cell (i.e., the resistance under which the cell is designed to operate most efficiently) is comparable to the shunt resistance (i.e., the internal resistance imposed by the defect region), whereas under AM-1 illumination, the load resistance is much lower by comparison. This occurs because, in a photovoltaic device, photogenerated current increases linearly with increasing illumination, while the resulting voltage increases exponentially. In other words, voltage attains a relatively high value under low illumination, the value increasing only slightly as the intensity of the illumination is increased. Therefore, under low intensity illumination the relatively high voltage potential present preferentially drives the relatively small number of photogenerated current carriers through the path of least resistance, i.e., the low resistance defect regions. In contrast thereto, under high intensity illumination, a large number of current carriers are present and are driven by a potential of about the same magnitude as the potential which exists under low illumination. This larger number of current carriers compete for a limited number of least resistance paths (through the defect regions). The result is that under high intensity illumination, while more power may be lost to the defect region, the power lost is a smaller percentage of the total photogenerated power than under low intensity illumination.

Defects or defect regions, the terms being interchangeably used herein, are not limited to "overt" or "patent" short circuit current paths. In some cases, the adverse effects of a defect are latent and do not immediately manifest themselves. Latent defects can give rise to what will be referred to hereinafter as an "operational mode failure," wherein a photovoltaic device, initially exhibiting satisfactory electrical performance, suddenly fails. The failures will be referred to herein as operational mode failures regardless of whether the device was previously connected to a load for the photogeneration of power, it only being necessary that the device was, at some time subjected to illumination, thereby initiating the photogeneration of charge carriers. It is believed the shunt defects, both latent and patent, arise from one or more irregularities in the (1) morphology of the exposed surface of the substrate material, or (2) in the growth of the layers of silicon alloy material thereupon.

The first, and perhaps most important, source of the defects, i.e., the aforementioned morphological irregularities existing on the deposition surface of the substrate material, will now be discussed. Even though the highest quality, for example, stainless steel is employed as the substrate upon which the layers of silicon alloy material are successively deposited, it has been calculated that from 10,000 to 100,000 irregularities per square centimeter are present on the deposition surface thereof. Such irregularities take the form of projections, craters, or other deviations from a smooth finish and may be under a micron in (1) depth below the surface, (2) height above the surface, or (3) diameter. Regardless of their configuration or size, the defects may establish a low resistance current path through the layers of silicon alloy material, thereby effectively short-circuiting the two electrodes. This may occur in numerous ways. For instance, a spike projecting from the surface of the substrate electrode may be of too great a height to be covered by the subsequent deposition of the thin film layers of silicon alloy material, and therefore, be in direct electrical contact with the other light incident electrode when that upper electrode is deposited atop the layers of silicon alloy material. Likewise, a crater formed in the surface of the substrate electrode may be of too large a size to be filled by the subsequent deposition of the silicon alloy material. In such an instance: (1) electrical current may bridge the gap which exists between the electrodes, or (2) during actual use (the photoinduced generation of electrical current) of the photovoltaic device, the material of one of the electrodes may, under the influence of the electrical field, migrate toward and contact the other of the electrodes, and thereby pass electrical current therebetween. It is also possible that in some cases the layers of silicon alloy material deposited onto the substrate include regions of irregular composition which can provide low resistance paths for the flow of electrical current between the electrodes of the photovoltaic device.

Further, despite all the previously described efforts to maintain the vacuum envelope free of external contaminants, dust or other particulate matter, which somehow either (1) invades the vacuum envelope during the deposition of the silicon alloy material, or (2) forms as a by-product of the deposition process, may be deposited over the substrate electrode along with the silicon alloy material. The contaminants interfere with the uniform deposition of the layers of silicon alloy material and may establish low resistance current paths therethrough.

Additionally, it is suspected that in some case, the silicon alloy material may form micro-craters or micro-projections during the deposition thereof, even absent the presence of contaminants or pollutants from external sources. Such morphological deviations from a perfectly smooth and even surface means that the substrate is covered by silicon alloy material either (1) in an "ultra thin layer" (consider again that the total thickness of all layers is only on the order of 4,000 Angstroms and any reduction in coverage is indeed an ultra thin layer) or (2) not at all. Obviously, when the upper electrode material (typically a conductive transparent oxide) is deposited across the entire surface of the body of silicon alloy material, the defect regions cause the low resistance current path to develop, and electrical current is shunted therethrough. In still other cases involving defect regions, the presence of such defect regions is only detectable due to their deleterious effect upon the electrical and photoelectric properties of the resultant photovoltaic device. Finally, note that the defects described hereinabove may not be sufficiently severe to divert all electrical current through the low resistance path. However, the diversion or shunting of any current therethrough represents a loss in operational efficiency of the photovoltaic device and should therefore be eliminated. Moreover, the shunting of even small amounts of current through each of thousands of defect regions may combine to cause major losses in efficiency. Based upon the foregoing, it should be apparent to one ordinarily skilled in the art that a reduction in current flow through these defects and defect regions is critical to the fabrication of high-yield, high efficiency, large area thin film photovoltaic devices.

Several approaches with which to cope with gross amplifications of this problem have been implemented by the instant inventors and their colleagues. As described in U.S. Pat. No. 4,451,970 of Masatsugu Izu and Vincent Cannella, entitled "System and Method for Eliminating Short Circuit Current Paths In Photovoltaic Devices", the disclosure of which is incorporated herein by reference, the shunting of current through defect regions is treated by substantially eliminating those defect regions as an operative area of the semiconductor device. This is accomplished in an electrolytic process where electrode material is removed from the periphery of the defect site, effectively isolating the defect regions and preventing the flow of electrical current therethrough. However, the process described in the '970 patent is current dependent, i.e., the greater the amount of current flowing through a particular area of the device, such as a defect region, the greater the amount of electrode material (in the preferred embodiment indium tin oxide) removed. Consequently, said short circuit eliminating process performs admirably in removing the electrode material from the periphery of a large defect, and thereby preventing all current flow therethrough. However, since the method is current dependent, it is not as successful in eliminating the flow of current between the electrodes in the thousands of defect regions which are relatively small. And as previously mentioned, since a great many relatively small current shunting paths, taken in toto, divert a substantial amount of current from its desired path of travel, the low resistance current paths created by such small defect regions must also be eliminated or at least substantially reduced. Further, the electrolytic process described in the '970 patent neither detects nor helps in preventing the formation of current-shunting paths in the case of operational mode failures.

In U.S. Pat. No. 4,419,530 of Prem Nath, entitled "Improved Solar Cell and Method For Producing Same", the disclosure of which is incorporated herein by reference, there is described a method for electrically isolating small area segments of amorphous, thin film, large area photovoltaic devices. This isolation of defects is accomplished by (1) dividing the large area device into a plurality of small area segments, (2) testing the small area segments for electrical operability, and (3) electrically connecting only those small area segments of the large area device exhibiting a predetermined level of electrical operability, whereby a large area photovoltaic device comprising only electrically operative small area segments is formed. While this method effectively reduces or eliminates the effect of defects, it is not completely satisfactory for several reasons.

The step of dividing the large area solar cell into electrically isolated small area segments requires several production steps and also reduces the total area of the solar cell that is available for producing electrical energy. Further, the method can be time and cost intensive since the electrical output of each isolated portion must be tested and separate electrical connections must be made to provide electrical contact to each small area segment. Also, since entire small area segments are effectively eliminated from the final cell if they manifest a defect, proportional losses of efficiency are greater than they would be if only the precise area of the particular defect were eliminated. In addition, it is possible that defects (shorts) in a solar cell can develop after the cell has been in use, and the concept of dividing the surface of the large area cell into small area segments does not correct this type of latent defect.

Further, both of the foregoing patent applications relate to "after market" techniques which are applicable to (1) isolate only gross defect-containing regions, and (2) prevent any and all current flow through those defect containing regions. Accordingly, a need still exists for a photovoltaic device which substantially eliminates the deleterious effects of shunts and other defects, both large and small, whatever their origin, without operatively removing large portions of the active body of silicon alloy material or the electrode disposed thereupon, while maintaining an acceptable level of current flow across the entire surface of the device.

Another such method and device is disclosed in U.S. Pat. No. 4,590,327, of Nath, et al, entitled "Photovoltaic Device and Method", the disclosure which is incorporated herein by reference. Disclosed therein are several configurations of current collecting bus grid structures for photovoltaic devices designed to minimize the effects of shorts, shunts, and other defects upon the performance of the devices. The structures for reducing the degrading effect of a low resistance current disclosed therein can be (1) a specifically designed layer of transparent electrically conductive material, (2) electrical isolation of the current carrying portions of the bus grid structure from the conductive layer, (3) resistive connections of the current collecting fingers to the remainder of the bus grid structure, (4) a buffered bus grid structure or a fuse-type connection, or (5) the grid or current collecting fingers which terminate when the current reaches a predetermined amount. While these solutions effectively reduce or eliminate the effect of defects, they are not completely satisfactory for several reasons. The specifically designed layers of transparent electrically conductive material are difficult to manufacture. Further, devices having terminable or otherwise destructible current collecting fingers reduce surface area otherwise available to photogenerate current as the fingers are terminated.

A differently configured photovoltaic device and method for eliminating the problems of shorts and shunts is disclosed in U.S. Pat. No. 4,633,034 of Nath, et al, entitled "Photovoltaic Device and Method", the disclosure of which is incorporated herein by reference. That application concerns a photovoltaic device having the current collecting bus grid structure disposed above the upper, transparent conductive electrode thereof. A pattern of electrical current flow restricting material is disposed between the layer of transparent conductive material and the substrate of the device, corresponding to, and disposed beneath, at least a portion of the superjacent current collection means. The pattern restricts the flow of electrical current between the portions of the current collection means and the substrate positioned beneath the body of amorphous silicon alloy material. However, it has been determined from actual manufacturing experience that such an internal current restricting material must be aligned with the current collection means to operate effectively, which requires exacting manufacturing techniques.

Accordingly, there exists a need for a defect tolerant photovoltaic device manufactured by a process which does not require exacting manufacturing techniques such as those required to align subjacent components thereof or to prepare specifically designed layers of transparent electrically conductive material.

Additionally, it must be pointed out that as much as 10% of the surface of a photovoltaic cell is occupied by a bus grid structure. Any reduction in this area, dedicated for use by the bus grid structure, would be welcomed because radiation incident thereupon is lost. More particularly, due to "shadowing," radiation incident upon said structure cannot pass to the photoactive region of the cell for the photogeneration of electron-hole pairs therein. If the thin grid fingers could be made longer, at least some of the wide bus bars could be eliminated, thereby increasing the active area of the photovoltaic cell available to photogenerate electron-hole pairs. However, in order to be able to elongate the grid fingers, the cell must be made more tolerant of short circuit defects than is currently the case.

Disclosed herein as the innovative features of the instant invention are configurations of photovoltaic devices which exhibit a high degree of operational tolerance to defects therein, and which utilize a novel current collecting bus grid structure disposed above the transparent conductive top electrode of the photovoltaic device, which bus grid structure can be optimized to maximize the active area of a photovoltaic device.

BRIEF SUMMARY OF THE INVENTION

Disclosed herein is a photovoltaic device having an improved charge carrier collection assembly. Amorphous silicon alloy photovoltaic devices typically include an electrically conductive lower substrate electrode, a photoactive body of silicon alloy material disposed over the electrically conductive substrate, which photoactive body is adapted to photogenerate charge carriers in response to light energy incident thereon, a layer of transparent conductive material disposed over at least a portion of the body of silicon alloy material to facilitate the collection of photogenerated charge carriers, and a current collecting grid disposed over the layer of transparent conductive material. The electrically conductive substrate of the photovoltaic device may be formed of a body of electrically conductive material or an electrically conductive film disposed on a dielectric substrate.

The present invention improves prior photovoltaic devices by having the current collecting grid secured to the layer of transparent conductive material at least in part by a conductive adhesive having a resistivity in the range of 10,000 to 30,000 ohms per square. In the preferred embodiment, the grid is secured to the layer of transparent conductive material by an electrically conductive epoxy adhesive. The conductive epoxy adhesive preferably includes silver or graphite particles suspended therein to facilitate the normal flow of photogenerated current while retaining the preferred resistivity under short circuit conditions.

The charge carrier collection assembly for such a photovoltaic device is improved by forming a current collecting grid from an electrically conductive foil layer secured atop the layer of transparent conductive material at least in part by the conductive adhesive. This conductive foil layer may be secured to the layer of transparent conductive material either by 1) depositing a conductive adhesive atop the layer of transparent conductive material and depositing the conductive foil layer atop the conductive adhesive, or 2) depositing a conductive adhesive on the conductive foil layer and subsequently laminating the conductive foil layer atop the layer of transparent conductive material. In either case, the conductive foil layer is secured to the layer of transparent conductive material by the conductive adhesive. Subsequently, a portion of the conductive foil layer is removed so as to form the current collecting grid pattern from the remaining (non-removed) portion of the conductive foil layer.

Preferably, the portion of the conductive adhesive which corresponds to the removed portion of the conductive foil layer is also removed, since the conductive adhesive is typically opaque and would otherwise interfere with the operation of the photovoltaic device. This step of removing a portion of the conductive adhesive may occur concurrent with or subsequent to the step of removing a portion of said conductive foil layer. In one preferred embodiment, the conductive adhesive is only partially cured prior to removing the portion of the foil layer to facilitate the removal of same. In those instances, the remaining portion of the conductive adhesive, which portion corresponds to the remaining portion of conductive foil layer, is completely cured after both the foil and adhesive portions are removed.

Preferably, the step of removing a portion of the conductive foil layer includes the step of etching the conductive foil layer, such as by photoresist techniques. Other commercially known techniques for etching or otherwise removing a portion of the conductive foil can be utilized without departing from the spirit or scope of the instant invention.

Finally, the method of the present invention preferably includes the step of depositing a transparent protective layer atop the layer of transparent conductive material and current collecting grid so as to protect the delicate structures of the photovoltaic device during subsequent handling and use of the photovoltaic device.

BRIEF DESCRIPTION OF THE DRAWINGS

These and other objects and aspects of the invention will become apparent in the detailed description of the invention hereinafter with respect to the drawings in which.

DETAILED DESCRIPTION OF THE PREFERRED EMBODIMENT

The invention disclosed herein is an improved photovoltaic device, of the aforementioned type, including means to substantially prevent, or at least substantially minimize, the deleterious effects of defect or shunt regions on the operation of the photovoltaic device. The present invention represents an improvement of prior art shunt reducing techniques by securing the current collecting grid to the layer of transparent conductive material, at least in part, by a conductive adhesive.

Figure 1:
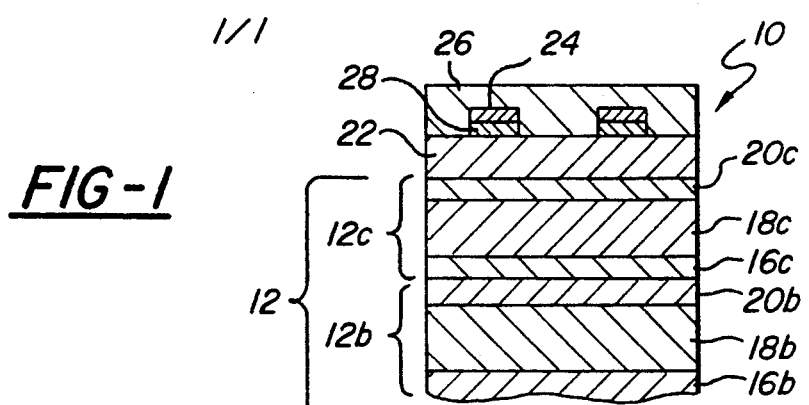
FIG. 1 is a fragmentary, cross-sectional view of a typical tandem photovoltaic device, said device comprising a plurality of p-i-n type cells, each layer of the cells formed from a discrete layer of silicon alloy material.
Figure 2:
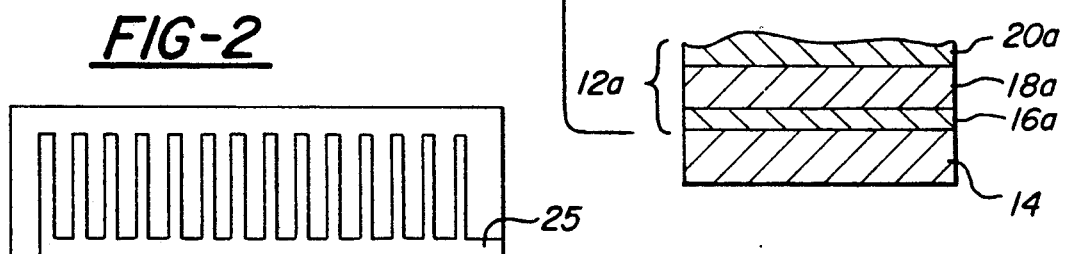
FIG. 2 is a top plan view of a photovoltaic device fabricated in the manner shown in FIG. 1 and illustrating a current collecting grid disposed thereupon.

Referring now to the drawings and particularly to FIG. 1, a photovoltaic cell formed of a plurality of successively deposited p-i-n layers, each of which includes a semi-conductor alloy is shown generally by the numeral 10. The tandem photovoltaic cell 10, illustrated in FIG. 1, does not embody the improved charge carrier collection assembly of the instant invention; however, it is typical of the type of photovoltaic cell in which the charge carrier collection assembly is incorporated, and accordingly, a detailed description the cell 10 is necessary in order to understand the operation of the improved assembly of the present invention.

More particularly, FIG. 1 shows a p-i-n type photovoltaic device, such as a solar cell, made up of individual p-i-n type cells 12a, 12b, and 12c. Below the lowermost cell 12a is a substrate 14, which (1) functions as the bottom electrode, and (2) may be transparent or formed from a metallic material such as stainless steel, aluminum, tantalum, molydenum, or chromium, or an insulating material such as glass with or without metallic particles embedded therein. Although certain applications may require a thin oxide layer and/or a series of base contacts prior to deposition of the semiconductor material, for purposes of this application, the term "substrate" shall include not only a flexible film, but also any elements added thereto by preliminary processing.

Each of the cells, 22a, 12b, and 12c is fabricated with an amorphous semiconductor body containing at least a silicon or germanium alloy material. Each of the semiconductor bodies includes a p-type conductivity semiconductor layer 16a, 16b, and 16c; an intrinsic semiconductor layer 18a, 18b and 18c; and an n-type conductivity semiconductor layer 20a, 20b, and 20c. As illustrated, cell 12b is an intermediate cell and, as indicated in FIG. 1, additional intermediate cells may be stacked atop the illustrated cells without departing from the spirit or scope of the present invention.

It is to be understood that following the deposition of the discrete layers of silicon alloy material, a further deposition process may be either performed in a separate environment or as a part of a continuous process. In this step, a layer of transparent conductive material 22, which in the preferred embodiment is a transparent conductive oxide (TCO) such as preferably, but not limited to, indium oxide, also referred to herein as the top or upper electrode, is deposited atop the uppermost layer of silicon alloy material. An electrode grid 24 may be applied where the cell is of a sufficiently large area, or if the conductivity of the TCO layer 22 is insufficient. The grid 24 may be made of copper or silver and may be in the form of a foil. The grid 24 shortens the carrier length and thus increases the collection efficiency. This will provide for longer grid lines and reduce the number of, if not totally eliminate, bus bars, thereby increasing the active area of the cell and improving the flux of incident radiation introduced into the body of amorphous silicon alloy material. A transparent protective layer 26 may be deposited atop the TCO layer 22 to protect the completed photovoltaic cell 10 from the environment.

While the cell 10 illustrated in FIG. 1 is a stacked assembly of p-i-n cells, the instant invention also embodies other cell arrangements such as single p-i-n cells, stacked or single n-i-p cells, p-n cells, Schottky barrier cells, and the like. Accordingly, in the description and claims which follow, the layer or layers of silicon alloy material disposed between the substrate 14 and the upper electrode 22 will be generally referred to as the "semiconductor body" and identified generally as body 12. This term is intended to include combinations of semiconductor layers of various conductivities and materials which will provide for a flow of electrical current when appropriately combined with one or more electrodes. This flow of electrical current is specifically defined to include the switching of current accomplished by photodiodes and phototransistors, as well as the generation of and collection of current accomplished by photovoltaic devices such as solar cells. Regardless of its ultimate configuration, it is for the purpose of substantially reducing the rate of flow of current through low resistance current paths (shunts), whether patent or latent, between the substrate electrode and the top electrode that the instant invention was developed.

Referring now FIGS. 2 through 5, the routineer in the art can appreciate that the improvement disclosed herein relates to the method of attaching the current collecting grid 25 through the use of a conductive adhesive 28 to the subjacent layer of transparent conductive oxide material 22.

The grid 25 is secured to the layer of transparent conductive material 22 by a conductive epoxy adhesive 28. Preferably, the conductive epoxy adhesive 28 has a resistivity in the range of 10,000 to 30,000 ohms per square so as to minimize the effective current carrying capacity of any particular portion of the grid as will be explained hereinafter. In another manner of stating the preferred resistivity of the adhesive, said resistivity can be stated in terms of milliamps of photogenerated current. In this case, a preferred resistivity is about 100 to 300 ohms per square per milliamp of current photogenerated by the cell. The conductive epoxy adhesive preferably includes silver or graphite particles suspended therein to facilitate the normal flow of photogenerated current while retaining a resistivity which prevents catastrophic (shunted) current flow. Such a conductive epoxy adhesive 28 is available from a variety of commercial sources, such as Emerson Cuming Co.

To form the charge carrier collection assembly of the present invention, a current collecting grid 25 is formed atop the layer of transparent conductive material by securing an electrically conductive foil layer 25a thereto. This conductive foil layer 25a may be preferably secured to the layer of transparent conductive material 22 either by (1) depositing an electrically conductive adhesive 28a atop the layer of transparent conductive material 22 and depositing the conductive foil layer 25a atop the conductive adhesive 28a, or by (2) depositing an electrically conductive adhesive 28a on the conductive foil layer 25a and subsequently depositing the conductive foil layer 25a atop the layer of transparent conductive material 22. In either case, the conductive foil layer 25a is secured to the layer of transparent conductive material 22 by the conductive adhesive 28. Of course, other securing techniques may be employed without departing from the spirit or scope of the invention.

Figure 4:
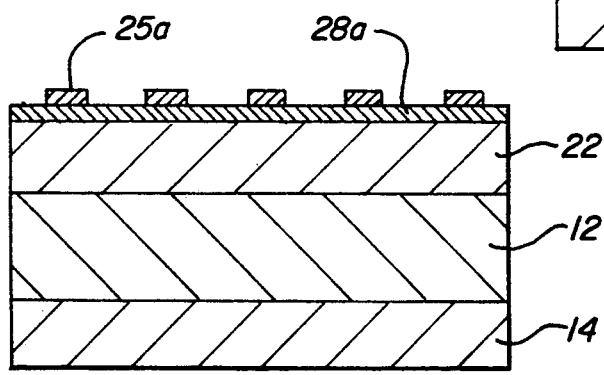
FIG. 4 is a cross-sectional view of a portion of the photovoltaic device depicted in FIG. 2 and taken along line 3—3, and depicted at an intermediate production stage after a portion of the conductive foil layer is removed so as to form a current collecting grid.

Subsequently, a portion of the conductive foil layer 25a is removed so as to form the desired pattern of the current collecting grid 25 from the portion of the conductive foil layer 25a remaining atop the layer of transparent conductive material 22. Preferably, this step is accomplished by etching the conductive foil layer 25a, such as by a positive photoresist technique. In this technique, a layer of photoresist (a polymeric mixture having light sensitive properties) material (not shown) is applied as a thin film to the surface of the conductive foil layer 25a. The photoresist mixture becomes more soluble to certain developers after being exposed to light. Therefore, the areas of the photoresist mask layer, directly corresponding to the areas of the conductive foil layer 25a to be removed, are exposed to light. These exposed areas of the photoresist are then removed by dissolving the photoresist in an appropriate developer. The conductive foil layer 25a is then subjected to an etching process which removes the exposed portions thereof, while the remaining photoresist resists etching and preserves the underlying portions of the conductive foil layer 25a. Thereafter, a suitable solvent can be used to remove the remaining photoresist and leave the photovoltaic device having a grid 25 disposed atop the electrically conductive adhesive 28a, as shown in FIG. 4. Using this technique, an intricate grid pattern can be readily created.

Negative photoresist etching or other commercially known techniques for etching or otherwise removing a portion of the conductive foil represent alternate preferred embodiments and can be utilized without departing from the spirit or scope of the instant invention. Importantly, prefabricated grid structures may also be attached using the conductive adhesive previously described without departing from the spirit or scope of the instant invention. Of course, other grid securement techniques can be employed, which techniques do not employ an adhesive directly applied to the foil layer. For instance, the grid lines could be screen printed.

The layer of conductive adhesive 28a may be left intact after the grid 25 is formed to protect the internal structures during subsequent handling operations associated with the manufacturing process. However, at some point, the portion of conductive adhesive 28a corresponding to the removed portion of conductive foil layer 25a must also be removed. This step of removing the portion of conductive adhesive corresponding to the portion of conductive foil layer may occur concurrent with (if no handling problems are anticipated) or subsequent to (if the device is to be handled before completing the manufacturing) the step of removing a portion of said conductive foil layer. In either case, an appropriate solvent dissolves the exposed portion of the conductive adhesive 28a in a controlled fashion to leave the portions 28 of the conductive adhesive layer 28a subjacent to the grid 25 intact.

For example, when the previously disclosed conductive epoxy adhesive 28 is utilized, said adhesive 28 is preferably only partially cured prior to removing the portion of the conductive foil layer 25a so as to facilitate the step of removing the corresponding portion of conductive epoxy adhesive 28a. A solvent, such as MEK, may be utilized to remove the portion of the epoxy adhesive exposed during the conductive foil layer 25a etching stage. The solvent is used in an appropriate manner, such as by controlling the strength, temperature, pressure and duration of solvent contact, so as to minimize removal of adhesive 28 disposed beneath the grid structures 25. Thereafter, the portions 28 of the conductive adhesive remaining after removing the exposed portions of the conductive adhesive, corresponding to the portion of conductive foil layer removed, are completely cured. Complete curing at an earlier stage makes removal of portions of the adhesive without damaging adjacent components difficult.

Finally, a transparent protective layer 26 is laminated atop the layer transparent conductive material 22 and current collecting grid 25 so as to protect the delicate structures of the photovoltaic device 10 during handling and use.

Figure 3:
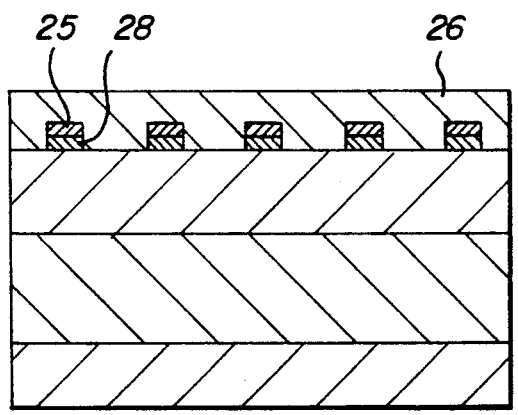
FIG. 3 is a cross-sectional view of a portion of the photovoltaic device depicted in FIG. 2 and taken along line 3—3, and illustrating one preferred embodiment of the improved current collecting assembly of the instant invention.
Figure 5:
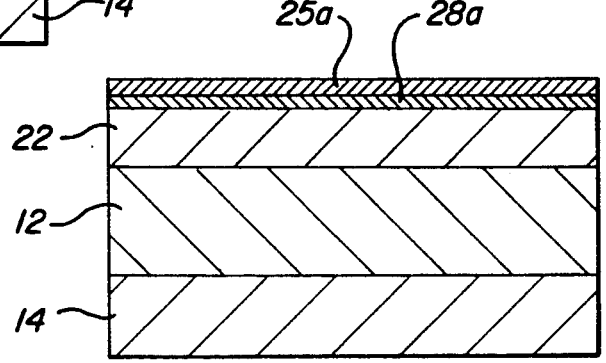
FIG. 5 is a cross-sectional view of a portion of the photovoltaic device depicted in FIG. 2 and taken along line 3—3, depicted at an intermediate production stage prior to having a portion of the conductive foil layer removed so as to form a current collecting grid.

Therefore, it can be seen that FIGS. 3 through 5 represent a progression of stages of the photovoltaic cell 10 in the manufacturing process associated with the herein disclosed etching process such that FIG. 5 represents the cell having an intact conductive foil layer 25a; FIG. 4 represents an intermediate stage having the conductive foil layer 25a etched into grid 25; and FIG. 3 represents the completed photovoltaic device 10. As should be immediately apparent to a routineer in the art, the process of the instant invention is well suited for automation. The method can be readily adapted for roll-to-roll operation. For example, a roll of the multi-layered semiconductor alloy material can be easily intertwined with and secured by a heat activated adhesive to a roll of the metallic foil. A subsequent etching method will then form the grid finger structure.

From the foregoing description of the preferred embodiments, it can be seen that various alternative embodiments of the invention can be anticipated without departure from the spirit or scope of the instant invention. Accordingly, the true scope of the instant invention is to be determined only by the broadest interpretation of the following claims.

We now claim:

1. A photovoltaic device having an improved charge carrier collection assembly, said device comprising an electrically conductive substrate electrode, an active body of semiconductor material disposed over the electrically conductive substrate electrode and adapted to provide for the photogeneration of charge carriers in response to light energy incident thereupon, a layer of transparent conductive material disposed over at least a portion of said body of semiconductor material to facilitate the collection of said photogenerated charge carriers, and a current collecting grid disposed over said layer of transparent conductive material, the improvement comprising in combination:

a body of conductive adhesive, having a resistivity in the range of 10,000 to 30,000 ohms per square, operatively disposed between said grid and said layer of transparent conductive oxide, whereby said grid is secured to said layer of transparent conductive material at least in part by said body of conductive adhesive and the resistivity of said body of conductive adhesive prevents catastrophic current flow therethrough.

2. The device of claim 1, wherein said current collecting grid is formed of copper.

3. The device of claim 1, wherein said current collecting grid is formed of silver.

4. The device of claim 1, wherein said current collecting grid is formed from a metallic foil.

5. The device of claim 1, wherein said conductive adhesive comprises an electrically conductive epoxy adhesive.

6. The device of claim 5, wherein said conductive epoxy adhesive includes silver particles suspended therein.

7. The device of claim 5, wherein said conductive epoxy adhesive includes graphite particles suspended therein.

8. A method of improving the charge carrier collection assembly for a photovoltaic device, said device comprising an electrically conductive substrate electrode, a photoactive body of semiconductor material disposed over the electrically conductive substrate electrode and adapted to photogenerate charge carriers in response to light energy incident thereon, a layer of transparent conductive material disposed over at least a portion of said body of semiconductor material to facilitate the collection of said photogenerated charge carriers, and a current collecting grid disposed over said layer of transparent conductive material, the improved method comprising the step of:

securing said current collecting grid stop said layer of transparent conductive material at least in part by a body of an electrically conductive adhesive having a resistivity in the range of 10,000 to 30,000 ohms per square.

9. The method of claim 8, wherein said step of securing a current collecting grid further comprises the steps of:

securing an electrically conductive foil layer atop said layer of transparent conductive material at least in part by said electrically conductive adhesive; and removing a portion of said conductive foil layer so as to form said current collecting grid from the remaining portion of said conductive foil layer.

10. The method of claim 9, wherein said step of securing a conductive foil layer comprises the step of securing a copper foil layer atop said layer of transparent conductive material.

11. The method of claim 9, wherein said step of securing a conductive foil layer comprises the step of securing a silver foil layer atop said layer of transparent conductive material.

12. The method of claim 9, wherein said step of securing a conductive foil layer comprises the steps of:

depositing said electrically conductive adhesive atop layer of said transparent conductive layer; and depositing said conductive foil layer atop said conductive adhesive.

13. The method of claim 9, wherein said step of securing a conductive foil layer comprises the steps of:

depositing said conductive adhesive on said conductive foil layer; and depositing said conductive foil layer atop said layer of transparent conductive material so as to secure said conductive foil layer to said layer of transparent conductive material at least in part by said conductive adhesive.

14. The method of claim 9, wherein said method further includes the step of removing the portion of conductive adhesive which corresponds to the portion of conductive foil layer removed during said step of removing a portion of said conductive foil layer.

15. The method of claim 14, wherein said step of removing the portion of conductive adhesive which corresponds to the portion of conductive foil layer occurs subsequent to said step of removing a portion of said conductive foil layer.

16. The method of claim 14, wherein said step of removing the portion of said conductive adhesive which corresponds to the portion of said conductive foil layer removed during said step of removing a portion of said foil layer occurs substantially simultaneously with said step of removing a portion of said conductive foil layer.

17. The method of claim 9, wherein said step of removing a portion of said conductive foil layer includes the step of etching said conductive foil layer.

18. The method of claim 17, wherein said step of etching said conductive foil layer further includes the step of photoresist etching said conductive foil layer.

19. A method as in claim 11, wherein the step of securing the electrically conductive foil comprises securing said foil with a body of a curable adhesive and only partially curing the adhesive, prior to the step of removing said portion of foil;

the method including the further steps of removing a first portion of said partially cured body of adhesive corresponding to said removed portion of foil and fully curing a remaining portion of said partially cured body of adhesive after said first portion is removed.

20. A method of providing a current collecting grid upon a photovoltaic device including the steps of:
providing an electrically conductive foil;
securing said foil to the light incident surface of the photovoltaic device with a body of a curable, electrically conductive adhesive;
partially curing said body of adhesive;
removing a portion of said foil, subsequent to the step of partially curing the body of adhesive, so as to form said current collecting grid;
removing a portion of said partially cured body of adhesive, which portion corresponds to the portion of said foil which was removed so, as to provide a non-removed portion of partially cured adhesive; and,
fully curing the non-removed portion of adhesive.

21. A method as in claim 20, wherein said curable adhesive is an epoxy adhesive.

22. A method as in claim 20, wherein the step of removing said portion of partially cured adhesive comprises removing said adhesive concurrent with the step of removing said portion of foil.

23. A method as in claim 20, wherein the step of removing said portion of partially cured adhesive comprises removing said adhesive after the step of removing said portion of foil.

* * * * *